(12) United States Patent
Suwada et al.

(10) Patent No.: US 7,103,525 B2
(45) Date of Patent: Sep. 5, 2006

(54) METHOD OF AND SYSTEM FOR HIGH-FREQUENCY-CORRESPONDING SIMULATION, AND COMPUTER PRODUCT

(75) Inventors: Makoto Suwada, Kawasaki (JP); Tatsuo Koizumi, Kawasaki (JP); Masaki Tosaka, Kawasaki (JP); Kazuhiko Tokuda, Kawasaki (JP); Jiro Yoneda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 664 days.

(21) Appl. No.: 09/929,047

(22) Filed: Aug. 15, 2001

(65) Prior Publication Data

US 2002/0032556 A1 Mar. 14, 2002

(30) Foreign Application Priority Data

Sep. 8, 2000 (JP) ............................. 2000-273268

(51) Int. Cl.
*G06F 17/50* (2006.01)
(52) U.S. Cl. ............................................. 703/15; 716/5
(58) Field of Classification Search ................. 703/14; 714/709; 324/250; 716/5
See application file for complete search history.

(56) References Cited

U.S. PATENT DOCUMENTS 3,638,183 A * 1/1972 Progler et al. ............... 714/709
5,374,861 A * 12/1994 Kubista ......................... 326/30
6,088,523 A * 7/2000 Nabors et al. ................ 703/14
6,148,221 A * 11/2000 Ishikawa et al. ............. 505/210

FOREIGN PATENT DOCUMENTS

| JP | 7-129656 A | 5/1995 |
|---|---|---|
| JP | 11-354815 A | 12/1999 |
| JP | 2000-101097 A | 4/2000 |

OTHER PUBLICATIONS

Chang et al., "Symbolic Sensitivity Analysis using Sspice" IEEE 1992 p. 508-511.*
Tosaka et al., "LIne Noise Analysis System "SIGAL" for Gigahertz Transmission" 2000 Fujitsu p. 297-302.*
Chang et al "Symbolic Sensitivity Analysis Using Sspice" 1992 IEEE p. 1043-1046.*

* cited by examiner

*Primary Examiner*—Leo Picard
*Assistant Examiner*—Tom Stevens
(74) *Attorney, Agent, or Firm*—Staas & Halsey LLP

(57) ABSTRACT

The high-frequency-corresponding simulation apparatus includes a control section that calculates a sum of the DC resistance value and skin resistance value of each of a plurality of elements corresponding to wiring patterns in accordance with circuit deign information, sorts resistance values corresponding to the elements by using a high-frequency element delay as a key when the total resistance value is equal to or larger than a first threshold value, integrates resistance values starting with a resistance value having the smallest high-frequency element delay, and which determines whether the result of the integration reaches a value immediately before a second threshold value whenever the integration is executed and a RLC-model analysis section.

12 Claims, 14 Drawing Sheets

FIG.3A
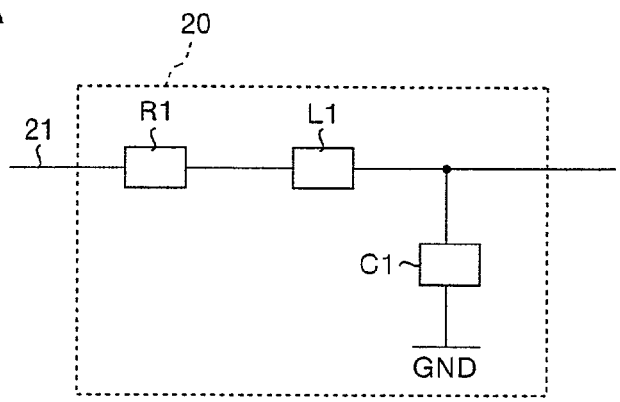
FIG.3B
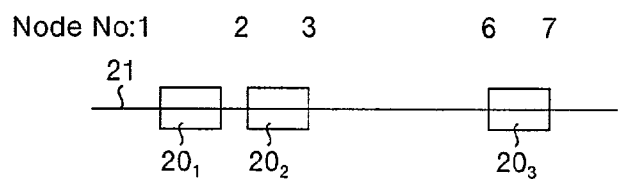
FIG.3C
Xaaaa   [node1]   [node2]   LINE01   R1=[R1]   L1=[L1]N   C1=[C1]P
FIG.3D
| X0 | 1 | 2 | LINE01 | R1=0.003 | L1=1.200N | C1=0.330P |
|----|---|---|--------|----------|-----------|-----------|
| X1 | 2 | 3 | LINE01 | R1=0.003 | L1=1.200N | C1=0.330P |
| ⋮  |   |   |        |          |           |           |
| X5 | 6 | 7 | LINE01 | R1=0.001 | L1=0.400N | C1=0.110P |

FIG.4A
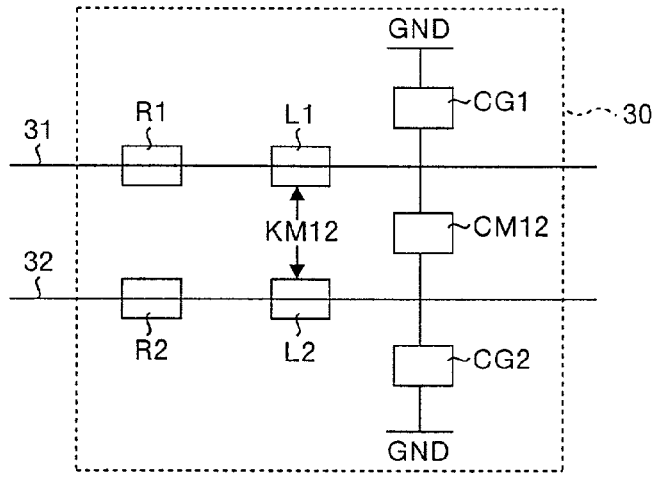
FIG.4B
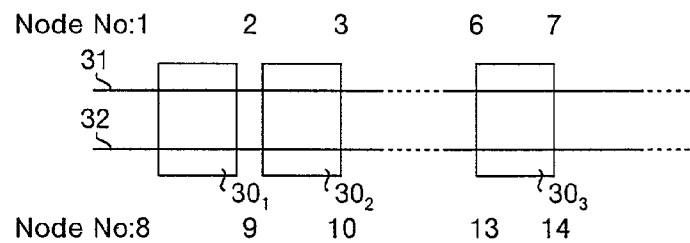
FIG.4C
```
33
Xaaaa    [D-ed-node1]    [D-ed-node2]   [D-ing-node1]   [D-ing-node2]   LINE02
+        R1=[R1]         L1=[L1]N       CG1=[CG1]P
+        R2=[R2]         L2=[L2]N       CG2=[CG2]P
+        CM12=[CM12]P    KM12=[KM12]
```
FIG.4D
```
34
X0   1   2   8   9   LINE02   R1=0.003    L1=1.200N    C1=0.330P
+                             R1=0.002    L1=1.000N    C1=0.200P
+                             CM12=0.300P  KM12=0.200
X1   2   3   9  10   LINE02   R1=0.003    L1=1.200N    C1=0.330P
+                             R1=0.002    L1=1.000N    C1=0.200P
+                             CM12=0.300P  KM12=0.200
.
.
X5   6   7  13  14   LINE02   R1=0.0015   L1=0.600N    C1=0.165P
+                             R1=0.001    L1=0.500N    C1=0.100P
+                             CM12=0.150P  KM12=0.200
```

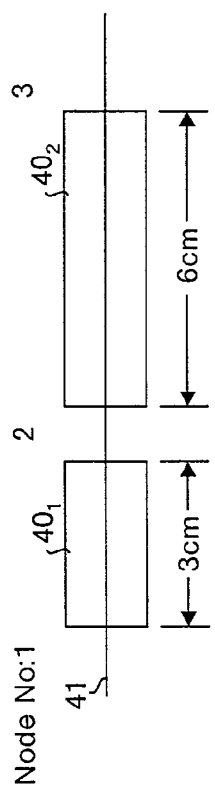

```
53
Waaaa   [d-ed-node1]  [d-ing-node1]  0  [d-ed-node2]  [d-ing-node2]  0
+       RLGCfile=[HIGH-FREQUENCY-ELEMENT FACTOR NAME] N=2  L=[length]
```

```
54
W001   1   4   0   2   5   0    RLGCfile=n001_254   N=2   L=0.03
W002   2   5   0   3   6   0    RLGCfile=n001_254   N=2   L=0.06
```

ENLARGED VIEW

```
RLGCparametors for a single line
*******************************************
*    N
     [N]
*    L0
     [L]
*    C0
     [C]
*    R0
     [R]
*    G0
     [G]
*    Rs
     [RS]
*    Gd
     [GD]
*******************************************
*end of RLGC parametors
```

```
RLGCparametors for a multi-conductor line
******************************************
*   N
    [N]
*   L0
    [L11]
    [L12]    [L22]
*   C0
    [C11]
    [C12]    [C22]
*   R0
    [R11]
    [R12]    [R22]
*   G0
    [G11]
    [G12]    [G22]
*   Rs
    [RS11]
    [RS12]   [RS22]
*   Gd
    [GD11]
    [GD12]   [GD22]

******************************************
*end of RLGC parametors
```

FIG.12

| d-ed<br>(RESISTANCE VALUE) | d-ing<br>(RESISTANCE VALUE) | TYPE OF HIGH-<br>FREQUENCY ELEMENT | tpd |
|---|---|---|---|
| W70(0.2Ω) | • | HIGH-FREQUENCY ELEMENT01 | MINIMUM |
| W60(0.3Ω) | • | HIGH-FREQUENCY ELEMENT02 | ↑ |
| W50(0.4Ω) | • | HIGH-FREQUENCY ELEMENT01 | |
| W40(0.5Ω) | • | HIGH-FREQUENCY ELEMENT01 | |
| W41(0.5Ω) | • | HIGH-FREQUENCY ELEMENT01 | |
| ⋮ | ⋮ | ⋮ | |
| | W42(0.6Ω) | HIGH-FREQUENCY ELEMENT01 | |
| W2(1Ω) | W2(1.4Ω) | HIGH-FREQUENCY ELEMENT02 | |
| (LnetR-mg LIMIT OF d-ed) | | | |
| • | W30(1.2Ω) | HIGH-FREQUENCY ELEMENT01 | |
| | (LnetR-mg LIMIT OF d-ing) | | |
| • | W31(1.6Ω) | HIGH-FREQUENCY ELEMENT01 | |
| W32(2Ω) | W32(2Ω) | HIGH-FREQUENCY ELEMENT02 | ↓ |
| • | • | • | INCREASE |

METHOD OF AND SYSTEM FOR HIGH-FREQUENCY-CORRESPONDING SIMULATION, AND COMPUTER PRODUCT

FIELD OF THE INVENTION

The present invention relates to a technology that makes it possible to decrease analysis time during used to analysis of high frequency.

BACKGROUND OF THE INVENTION

Frequencies used for information equipment including network units and a personal computers have been remarkably improved recently and are newly reaching a gigahertz band from a megahertz band. Thereby, a signal analysis considering influences of various noises is also requested for a high-frequency signal for transmitting the wiring pattern of a printed circuit board.

A circuit designer of an integrated circuit or the like selects a circuit device constituting a circuit or the value of a parameter for controlling the characteristic of the circuit device.

At present, a circuit simulator is used when designing circuits. The circuit simulator simulates a circuit operation on a computer without fabricating an actual circuit and shows the circuit operation for a designer. The simulator operated by the software referred to as SPICE2 developed by University of California at Berkley in 1972 is publicly known.

For example, the circuit simulator executes simulation in accordance with the connection data between circuit devices constituting a circuit to be analyzed and device parameters to estimate an amount of noise under a predetermined operational state of each circuit device and display or print the estimated number of noises.

As described above, the conventional circuit simulator is good for the waveform analysis up to approx. 100 MHz and is greatly supported by various designers. Because frequencies of information equipment have been remarkably raised recently and are reaching a gigahertz band from a megahertz band, a waveform analysis considering influences of various noises is requested for a high-frequency signal for transmitting a wiring pattern to a printed circuit board.

The skin effect is a typical one influencing a transmission waveform in a high-frequency band (approx. 300 MHz or higher). This is a phenomenon in which current is concentrated on the surface of a printed circuit board and resultantly a resistance component increases to cause a waveform distortion. That is, in the graph G shown in FIG. 15, the waveform L1 denotes a result of performing an analysis by a circuit simulator without considering the skin effect. The waveform L2 denotes a result of performing an analysis by a circuit simulator by considering the skin effect. As shown in the graph G, a large difference is produced in the rise of a waveform which is an analysis result between a case of considering the skin effect and a case of not considering the skin effect.

In the case of a conventional circuit simulator, however, an analysis is performed by using a loss transmission-line element referred to as a high-frequency element in order to perform the analysis by considering the skin effect. In this case, when modeling an actual wiring pattern, a portion (curved portion) in which specifications of a wiring pattern are changed is modeled into a micro high-frequency element having an unexpectedly small wiring length. In this case, it is a problem that waveform analysis time increases as the number of micro high-frequency elements increases.

Therefore, when considering the skin effect, that is, when performing an analysis correspondingly to a high frequency, a convention circuit simulator is not practical because a wave analysis requires approx. 3,000 hr due to influences of the micro high-frequency element.

SUMMARY OF THE INVENTION

It is object of this invention to provide a method of and apparatus for high-frequency-corresponding simulation. It is another object of this invention to provide a computer-readable recording medium that stores a computer program which when executed on a computer realizes the method according to the present invention on the computer.

The high-frequency-corresponding simulation apparatus according to one aspect of this invention comprises an element setting unit which sets a plurality of elements corresponding to wiring patterns in accordance with circuit design information; a resistance-value calculation unit which calculates the total of resistance values each of which is the sum of the DC resistance value and skin resistance value of each of the elements as the total resistance value; a first determination unit which determines whether the total resistance value is less than a first threshold value; a sorting unit which sorts resistance values corresponding to the elements when the total resistance value is equal to or larger than the first threshold value in accordance with a determination result by said first determination unit; a second determination unit which integrates the resistance values starting with a resistance value having the smallest high-frequency element delay and determines whether the integration result reaches a value immediately before a second threshold value whenever the integration is executed; and an analysis unit which executes an analysis by using an element corresponding to an integrated resistance value as a RLC model and elements other than the element as high-frequency element models when said second determination unit determines that the integration result reaches the value immediately before the second threshold value.

The high-frequency-corresponding simulation method according to another aspect of this invention comprises the steps of: setting a plurality of elements corresponding to wiring patterns in accordance with circuit design information; calculating the total of resistance values each of which is the sum of the DC resistance value and skin resistance value of each of the elements as the total resistance value; determining whether the total resistance value is less than a first threshold value; sorting resistance values corresponding to the elements by using a high-frequency element delay as a key when it is determined that the total resistance value is equal to or larger than the first threshold value; integrating the resistance values starting with a resistance value having the smallest high-frequency element delay; determining whether the result of integration reaches a value immediately before a second threshold value whenever the integration is executed; and executing an analysis by using an element corresponding to an integrated resistance value as a RLC model and elements other than the element as high-frequency element models when it is determined that the integration result reaches the value immediately before the second threshold value.

The computer-readable recording medium according to another aspect of this invention stores a computer program which when executed on a computer realizes the method according to the present invention on the computer.

Other objects and features of this invention will become apparent from the following description with reference to the accompanying drawings.

BRIEF DESCRIPTION OF THE DRAWINGS

FIG. 3A to FIG. 3D are illustrations for explaining a RLC simplex wiring model of the embodiment in FIG. 1;

FIG. 4A to FIG. 4D are illustrations for explaining a RLC parallel wiring model of the embodiment in FIG. 1;

FIG. 5A to FIG. 5C are illustrations for explaining a high-frequency-element simplex wiring model of the embodiment in FIG. 1;

FIG. 8 is an illustration showing the format of a high-frequency-element factor file for a simplex wiring model of the embodiment in FIG. 1;

FIG. 9 is an illustration showing the format of a high-frequency-element factor file for a parallel wiring model of the embodiment in FIG. 1;

FIG. 12 is an illustration for explaining operations of the embodiment in FIG. 1;

DESCRIPTION OF THE PREFERRED EMBODIMENTS

Embodiments of the method of and apparatus for high-frequency-corresponding simulation, and the computer-readable recording medium according to the present invention will be described below in detail by referring to the accompanying drawings.

Figure 1:
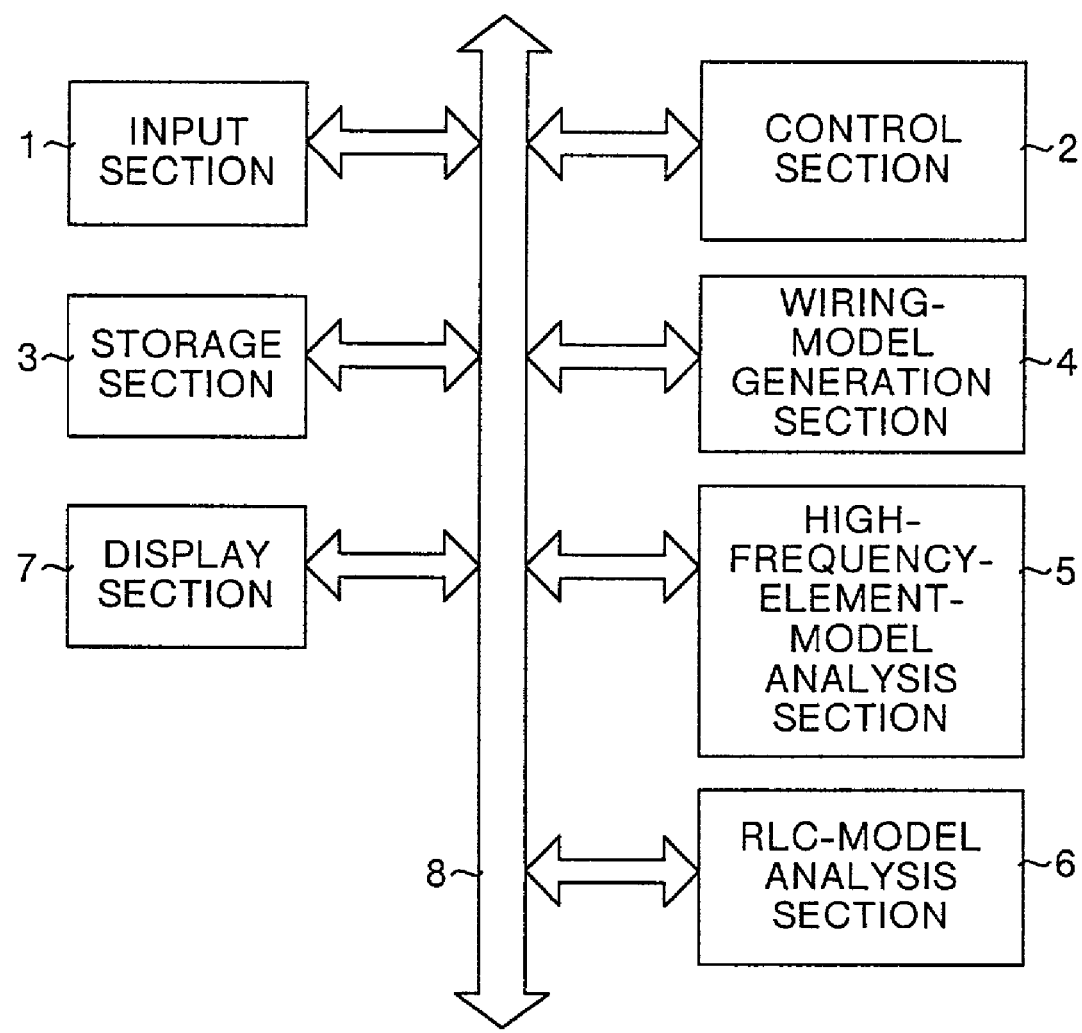
FIG. 1 is a block diagram showing a configuration of an embodiment of the present invention.

FIG. 1 is a block diagram showing a configuration of an embodiment of the present invention. A configuration of a high-frequency-corresponding simulation apparatus to be applied to the design of a high-frequency circuit is shown in FIG. 1. As shown in FIG. 1, the input section 1 is for inputting wiring data, parameters, and various commands of a circuit to be designed. The control section 2 controls each section of the apparatus. Operations of the control section 2 will be described in detail later.

The storage section 3 stores wiring data and parameters. The wiring-model generation section 4 generates a wiring model for signal analysis in accordance with the wiring data. The high-frequency element-model analysis section 5 analyzes a high-frequency element model. The RLC-model analysis section 6 analyzes a RLC model. The display section 7 displays the analysis results and the like. The high-frequency element model and the RLC model shall be described in detail later.

Figure 2:
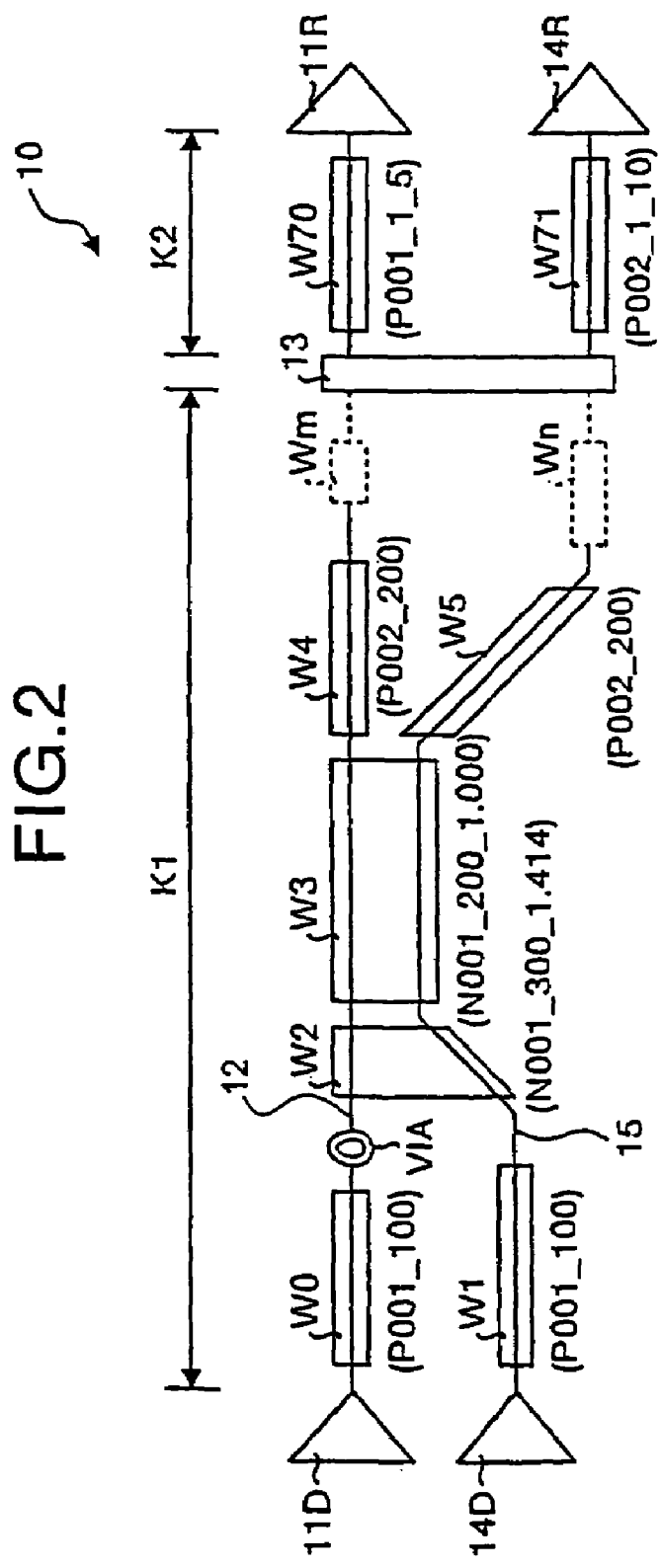
FIG. 2 is an illustration showing a wiring pattern 10 of the embodiment in FIG. 1.

FIG. 2 is an illustration showing a model of a wiring pattern 10 to be analyzed by a high-frequency-corresponding simulation apparatus. In FIG. 2, a wiring pattern 12 and a wiring pattern 15 are illustrated in parallel. A driver 11D and a receiver 11R are set to both ends of the wiring pattern 12. The driver 11D transmits a signal through the wiring pattern 12. The receiver 11R receives the signal.

Moreover, a driver 14D and a receiver 14R are set to the both ends of the wiring pattern 15. The driver 14D transmits a signal through the wiring pattern 15. The receiver 14R receives the signal. Furthermore, a section K1 and a section K2 are present through a connector 13 in the wiring pattern 10.

The wiring pattern 10 is modeled every divided wiring pattern by noting the portion in which specifications of a wiring pattern are changed or the mutual interference between wiring patterns as shown in FIG. 2. That is, in FIG. 2, the following are generated: simplex wiring models W0, W4, . . . , Wm, . . . , W70 and W1, W5, . . . Wn, . . . , W71 not considering the mutual inductance or mutual capacitance between wiring patterns and parallel wiring models W2 and W4 considering the mutual inductance and mutual capacitance between wiring patterns. In this case, the simplex wiring models and parallel wiring models include models corresponding to RLC (where R represents resistance, L represents inductance, and C represents capacitance) to be described later and models corresponding to high-frequency elements.

Specifically, there are the following four models.
(1) RLC simplex wiring model (Refer to FIG. 3A.)
(2) RLC parallel wiring model (Refer to FIG. 4A.)
(3) High-frequency-element simplex wiring model (Refer to FIG. 5A.)
(4) High-frequency-element parallel wiring model (Refer to FIG. 6A.)

The RLC simplex wiring model 20 shown in FIG. 3A is a model corresponding to a simplex wiring pattern 21, which is shown by an equivalent circuit constituted of a resistance R1, an inductance L1, and a capacitance C1. FIG. 3B is an illustration showing an image when RLC simplex wiring models 201, 202, and 203 are continuously present along the wiring pattern 21. In the case of a high-frequency-corresponding simulation apparatus, node Nos. 1, 2, 3, 6, and 7 are provided for the both ends of each line segment of the wiring pattern 21.

Moreover, the high-frequency-corresponding simulation apparatus realizes the RLC simplex wiring models are shown by the RLC simplex wiring-model format 22 shown in FIG. 3C. Xaaaa denotes a call statement. [Node1] corresponds to one node No. of a line segment of the wiring pattern 21. [Node2] corresponds to another node No. of a line segment of the wiring pattern 21.

LINE01 corresponds to the wiring pattern 21. R1=[R1] corresponds to the resistance value of a line segment of the wiring pattern 21. L1=[L1] corresponds to the inductance of a line segment of the wiring pattern 21. C1=[C1] corresponds to the capacitance of a line segment of the wiring pattern 21. FIG. 3D is an illustration showing a specific example 23 of the RLC simplex wiring model format 22.

The RLC parallel wiring model 30 shown in FIG. 4A is a model corresponding to wiring patterns 31 and 32 arranged in parallel, which is shown by an equivalent circuit constituted of the resistance R1, inductance L1, and capacitance CG1 of the wiring pattern 31, the resistance R2, inductance L2, and capacitance CG2 of the wiring pattern 32, and mutual inductance KM12 and mutual capacitance CM12 between the wiring patterns 31 and 32.

FIG. 4B is an illustration showing an image when RLC parallel wiring models 301, 302, and 303 are continuously present along the wiring patterns 31 and 32 arranged in parallel. In the case of a high-frequency-corresponding simulation apparatus, node Nos. 1, 2, 3, 6, and 7 are provided for the both ends of each line segment of the wiring pattern 31 and node Nos. 8, 9, 10, 13, and 14 are provided for the both ends of each line segment of the wiring pattern 32.

Moreover, the high-frequency-corresponding simulation apparatus realizes the RLC parallel wiring models are shown by the RLC parallel wiring model format 33 shown in FIG. 4C. Xaaaa denotes a call statement. [D-ed Node1] corresponds to one node No. of a line segment of the wiring pattern 31. [D-ed Node2] corresponds to the other node No. of the line segment of the wiring pattern 31. [D-ing Node1] corresponds to one node No. of a line segment of the wiring pattern 32. [D-ing Node2] corresponds to the other node No. of the line segment of the wiring pattern 32.

LINE02 corresponds to the wiring patterns 31 and 32. R1=[R1], L1=[L1], CG1=[CG1], R2=[R2], L2=[L2], CG2=[CG2], CM12=[CM12], and KM12=[KM12] correspond to R1, L1, CG1, R2, L2, CG2, CM12, and KM12 shown in FIG. 4A. FIG. 4D is an illustration showing a specific example 34 of the RLC parallel wiring model format 30.

The high-frequency-element simplex wiring models $40_1$ and $40_2$ shown in FIG. 5A are models corresponding to a simplex wiring pattern 41. These high-frequency-element simplex wiring models 401 and 402 are shown by the declarative statement Waaaa of a high-frequency-element simplex wiring model, [node1] and [node2], a high-frequency-element factor name describing an electrical constant, and an element length L like the high-frequency-element simplex wiring model format 42 shown in FIG. 5B.

The high-frequency-element factor name corresponds to the name "P001_100" (POOL: pattern case, 100: pattern width) of the simplex-wiring-model high-frequency-element file name 70 shown in FIG. 8. FIG. 5C is an illustration showing a specific example 43 of a simplex wiring-model format 42.

Figures 6A, 6B, 6C:
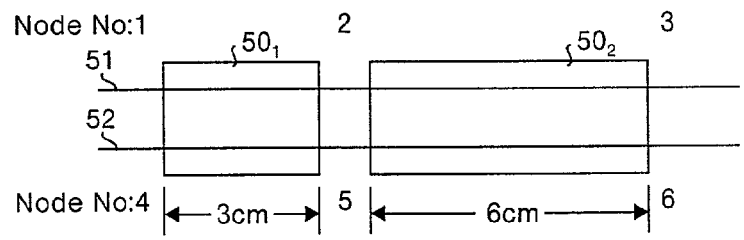
FIG. 6A to FIG. 6C are illustrations for explaining a high-frequency-element parallel wiring model of the embodiment in FIG. 1.

Variables of the simplex wiring-model high-frequency-element factor file 70 are listed below.
N: Number of wiring patterns (1 for simplex)
L: Inductance
C: Capacitance
R: DC resistance value
G: Conductance
RS: Skin resistance coefficient
GD: Inductive loss factor The high-frequency-element parallel wiring models $50_1$ and $50_2$ shown in FIG. 6A are models corresponding to wiring patterns 51 and 52 arranged in parallel. These high-frequency-element parallel wiring models $50_1$ and $50_2$ are shown by the declarative statement Waaaa of a high-frequency-element parallel wiring model, [d-ed-node1] corresponding to the wiring pattern 51, [d-ing-node1] corresponding to the wiring pattern 52, [d-ed-node2] corresponding to the wiring pattern 51, [d-ing-node2] corresponding to the wiring pattern 52, a high-frequency-element factor name describing an electrical constant, and an element length L like the high-frequency-element parallel wiring model format 53 shown in FIG. 6B.

The high-frequency-element factor name corresponds to the name "N001_254_1.414" (N001: noise case, 254: pattern pitch, 1.414: diagonal correction factor) of the parallel-wiring-model high-frequency-element factor file 80 shown in FIG. 9. FIG. 6C is an illustration showing a specific example 54 of the high-frequency-element parallel wiring model format 53.

Variables of the parallel-wiring-model high-frequency-element factor file 80 are listed below.
N: Number of wiring patterns (2 for parallelism)
L11: Inductance of wiring pattern 51
L22: Inductance of wiring pattern 52
L12: Mutual inductance between wiring patterns 51 and 52
C11: Capacitance of wiring pattern 51
C22: Capacitance of wiring pattern 52
C12: Mutual capacitance between wiring patterns 51 and 52
R11: DC resistance value of wiring pattern 51
R22: DC resistance value of wiring pattern 52
R12: 0 (Fixed)
G11: Conductance of wiring pattern 51
G22: Conductance of wiring pattern 52
G12: Mutual conductance between wiring patterns 51 and 52
RS11: Skin-resistance coefficient of wiring pattern 51
RS22: Skin-resistance coefficient of wiring pattern 52
RS12: 0 (Fixed)
GD11: Inductive loss factor of wiring pattern 51
GD22: Inductive loss factor of wiring pattern 52
GD12: Mutual inductive loss factor between wiring patterns 51 and 52

Figure 7A:
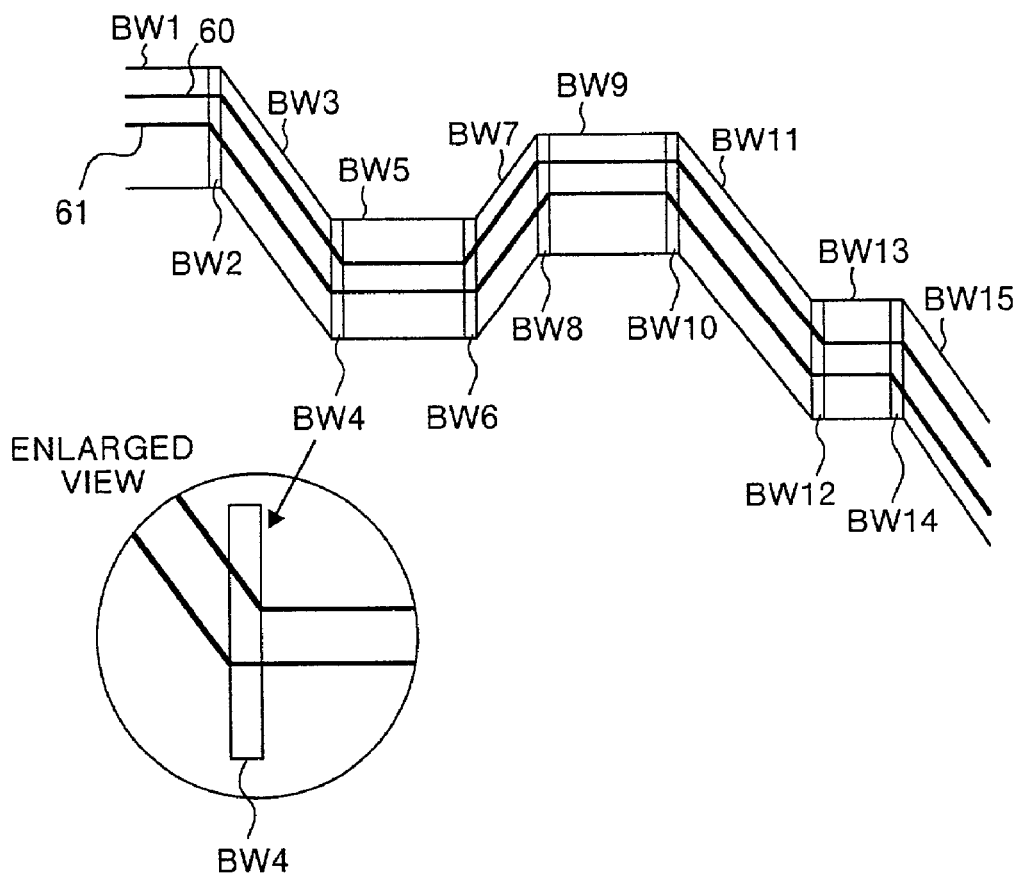
FIG. 7A and FIG. 7B are illustrations for explaining a micro high-frequency element of the embodiment in FIG. 1.
Figure 7B:
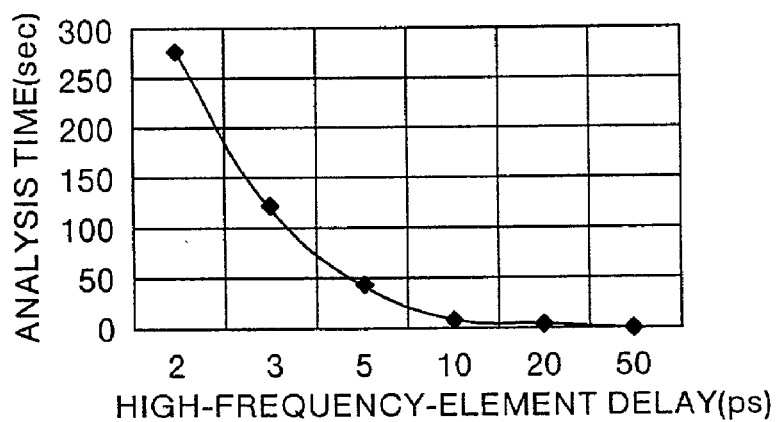

FIGS. 7A and 7B are illustrations for explaining the micro high-frequency element. FIG. 7A shows wiring patterns 60 and 61 arranged in parallel. When modeling these wiring patterns 60 and 61, wiring models BW1 to BW15 are generated. In this case, portions where specifications of a wiring pattern are changed (curved portion) unexpectedly have a small wiring length. That is, the portions are modeled into micro high-frequency elements BW2, BW4, BW6, BW8, BW10, BW12, and BW14 respectively having a small high-frequency element delay (refer to FIG. 7B).

In this case, as shown in FIG. 7B, analysis time tends to increase like a quadratic function. Therefore, in the case of an analysis, the whole analysis time increases as the number of micro high-frequency elements increases. The embodiment is characterized by decreasing the number of micro high-frequency elements in calculation to decrease the whole analysis time.

Figure 10:
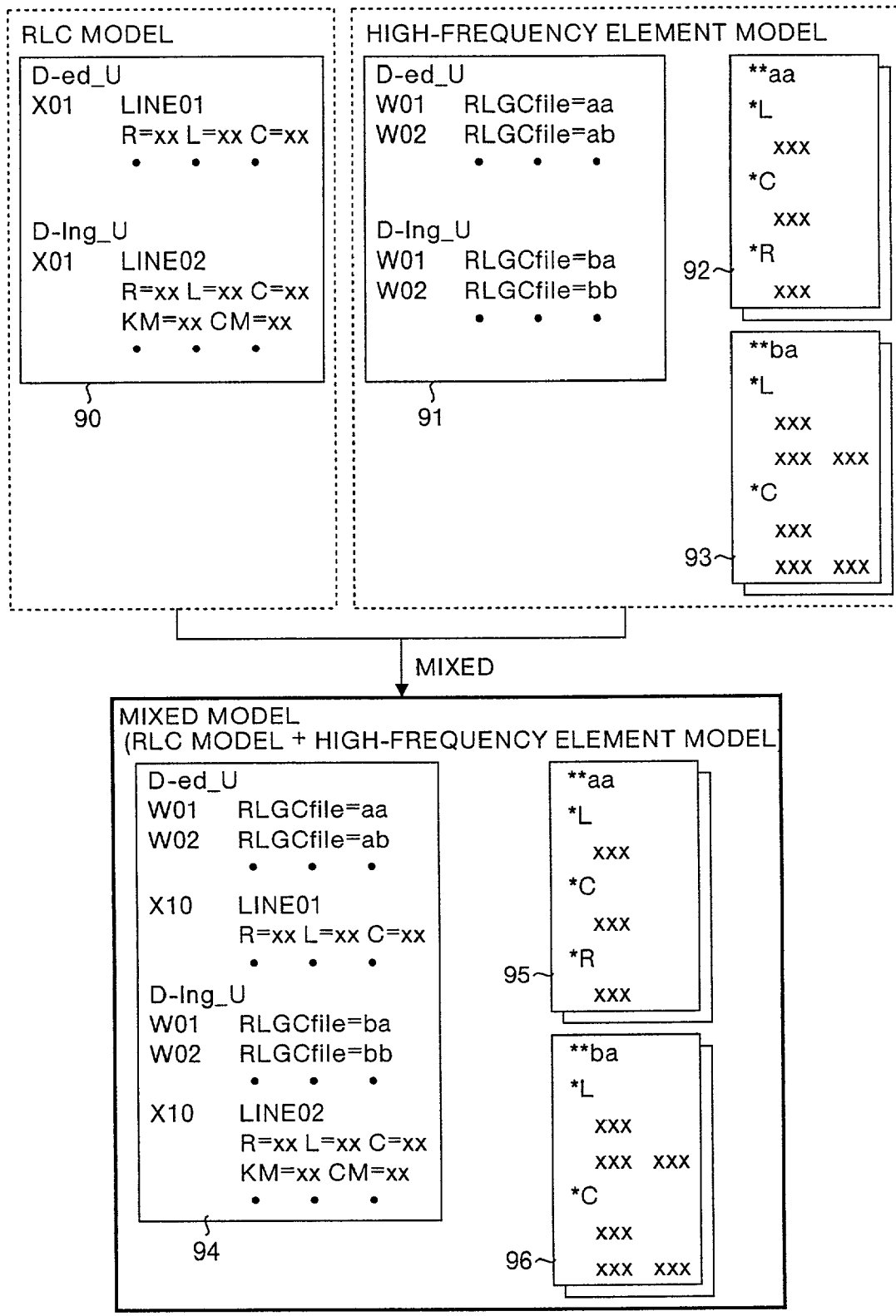
FIG. 10 is an illustration for explaining the operational theory of the embodiment in FIG. 1.

FIG. 10 is an illustration for explaining the operational theory of the embodiment. In FIG. 10, when performing an analysis by using a factor 90 of a RLC model, a problem occurs that an analysis accuracy lowers when applying the factor 90 to a high frequency because it does not correspond to the high frequency. Moreover, when performing an analysis by using factors 91, 92 and 93 corresponding to a high-frequency element model, an advantage is obtained that the analysis accuracy rises because they correspond to a high frequency. However, a critical problem occurs that analysis time is greatly increased due to the influence of the micro high-frequency element and they are not practically used.

Therefore, in the case of the embodiment, a factor 94 of a RLC model is mixed with factors 95 and 96 of high-frequency elements to decrease analysis time while keeping an analysis accuracy.

Operations of this embodiment are described below by referring to the flowchart shown in FIG. 11. In step SA1 shown in FIG. 11, wiring data, parameters, and various commands of a circuit to be designed are input from an input section 1. In step SA2, a control section 2 determines whether to execute an analysis in which all wiring models are used as high-frequency element models. When the determination result is "Yes", a wiring-model generation section 4 executes the high-frequency-element modeling of changing all wiring patterns to high-frequency element models in step SA3.

Therefore, in the case of the high-frequency-element modeling, many micro high-frequency element models shown in FIG. 7A are generated. In step SA4, a high-frequency-element-model analysis section 5 performs an analysis (corresponding to the high-frequency element model shown in FIG. 10) by using the high-frequency element models. In this analysis, analysis time is increased due to the influence of an micro high-frequency element.

However, when the determination result in step SA2 is "No", the control section 2 determines in step SA5 whether the total resistance value [LnetR] of high-frequency elements corresponding to the wiring patterns 12 and 15 shown in FIG. 2 is less than a preset threshold value [LnetR-mg]. The total resistance value [LnetR] is the sum of the DC resistance value and skin resistance value of a high-frequency element.

The total resistance value [LnetR] is obtained from the following expression.

Total resistance value [LnetR]=Σ[LnetR-high-frequency element]

[LnetR-high-frequency element] is obtained for the-described high-frequency-element simplex wiring model (refer to FIG. 5A) and the high-frequency-element parallel wiring model (refer to FIG. 6A) respectively as described below.

<For high-frequency-element simplex wiring model>
[LnetR-high-frequency element] is obtained for the wiring pattern 12 and the wiring pattern 15 respectively.

[LnetR-high-frequency element]=Σ(([R+RS× √(fs)]×[L high-frequency element])×adj_LnetR), where
R: DC resistance value of each high-frequency element
RS: Skin resistance coefficient of each high-frequency element
[L high-frequency element]:Length of each high-frequency element
fs: Frequency used for skin-resistance calculation adj_LnetR: Resistance correction factor
A high-frequency element delay [tpd] (refer to FIG. 7B) is obtained from the following expression.

[tpd]=(√(L×C))×[L high-frequency element]

<For high-frequency-element parallel wiring model (1)>
[LnetR-high-frequency element] is obtained for the case of noting the wiring pattern 12 out of the wiring patterns 12 and 15.

[LnetR-high-frequency element]=Σ(([R11+RS11× √(fs)]×[L high-frequency element])×adj_LnetR), where
R11: DC resistance value of each high-frequency element corresponding to wiring pattern 12
RS11: Skin resistance coefficient of each high-frequency element corresponding to wiring pattern 12
[L high-frequency element]: Length of each high-frequency element
fs: Frequency used for skin-resistance calculation adj_LnetR: Resistance correction factor
A high-frequency-element delay [tpd] (refer to FIG. 7B) is obtained from the following expression.

[tpd]=(√(L11×L12)×(C11×C12))×[Lhigh-frequency element]

<For high-frequency-element parallel wiring model (2)>
[LnetR-high-frequency element] is obtained for the case of noting the wiring pattern 15 out of the wiring patterns 12 and 15.

[LnetR-high-frequency element]=Σ(([R22+RS22× √(fs)]×[L high-frequency element])×adj_LnetR), where
R22: DC resistance value of each high-frequency element corresponding to wiring pattern 15
RS22: Skin resistance coefficient of each high-frequency element corresponding to wiring pattern 15
[L high-frequency element]: Length of each high-frequency element
fs: Frequency used for skin resistance calculation adj_LnetR: Resistance correction factor
A high-frequency element delay [tpd] (refer to FIG. 7B) is obtained from the following expression.

[tpd]=(√(L22×L12)×(C12×C12))×[L high-frequency element]

Figure 11:
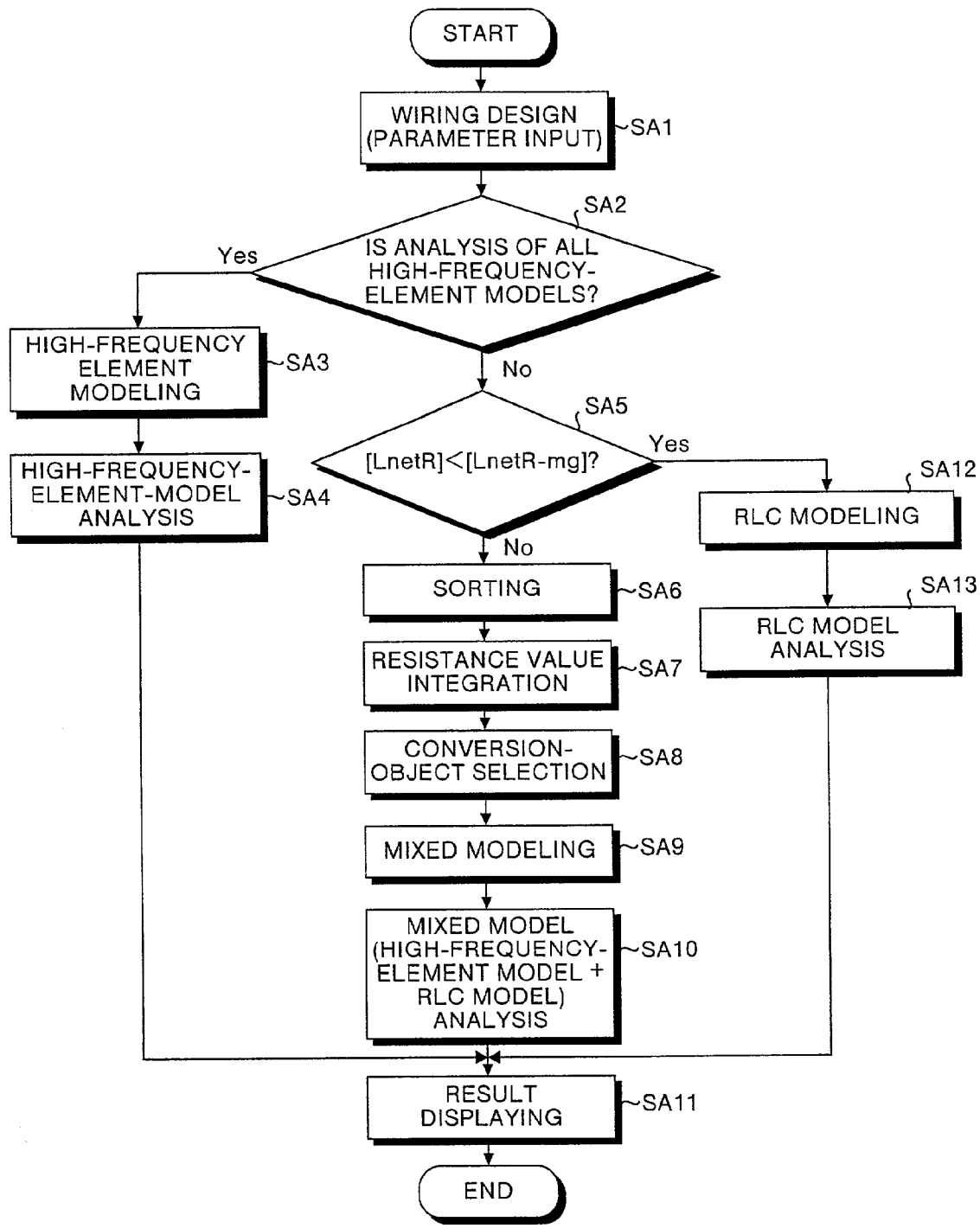
FIG. 11 is a flowchart for explaining operations of the embodiment in FIG. 1.

In this case, when the total resistance value [LnetR] is less than the threshold value [LnetR-mg], that is, when correspondence to a high frequency is unnecessary, the control section 2 sets the determination result in step SA5 shown in FIG. 11 to "Yes". In step SA12, the wiring-model generation section 4 executes RLC modeling of changing all wiring patterns into RLC models. In this case, a skin resistance corresponding to fs (frequency used for skin resistance calculation) is superimposed on the DC resistance of a RLC model. In this case, the value of the skin resistance to be superimposed can be changed through setting using the input section 1. In step SA13, the RLC model analysis section 6 performs an analysis (corresponding to RLC model shown in FIG. 10) by using the RLC models.

However, when the determination result in step SA5 is "No", that is, when correspondence to a high frequency is necessary and analysis time is decreased, the control section 2 executes sorting in step SA6. That is, in the high-frequency-element model list 100 shown in FIG. 12, the control section 2 sorts high-frequency element models starting with a high-frequency element model having the smallest high-frequency element delay tpd. In the high-frequency-element model list 100, d-ed (resistance value) corresponds to the wiring pattern 12 (or wiring pattern 15) and d-ing corresponds to the wiring pattern 15 (or wiring pattern 12).

In step SA7, the control section 2 integrates resistance values. Specifically, the control section 2 successively integrates d-ed (resistance value: DC resistance value+skin resistance value) and d-ing (resistance value: DC resistance value+skin resistance value) shown in FIG. 12 in order of sorting and compares each resistance-value integration result [ΣLnetR] with the threshold value [LnetR-mg] whenever performing the integration. The threshold value [LnetR-mg] can be changed through setting using the input section 1. In the comparison, the control section 2 executes resistance-value integration up to a value immediately before the resistance-value integration result [ΣLnetR] reaches the threshold value [LnetR-mg].

The resistance-value integration result [ΣLnetR] is obtained from the following expression.

Resistance-value integration result [ΣLnetR]=Σ[ ΣLnetR-high-frequency element]

[ΣLnetR-high-frequency element] is obtained for the above-described high-frequency-element simplex wiring model (refer to FIG. 5A) and the high-frequency-element model (refer to FIG. 6A) respectively as described below.

<For high-frequency-element simplex wiring model>
[ΣLnetR-high-frequency element] is obtained for the wiring pattern 12 and the wiring pattern 15 respectively.

$$[\Sigma \text{LnetR-high-frequency element}] = \Sigma(([R+RS \times \sqrt{(fs)}] \times [L \text{ high-frequency element}]) \times \text{adj\_LnetR}),$$

where
R: DC resistance value of each high-frequency element
RS: Skin resistance coefficient of each high-frequency element [L high-frequency element]: Length of each high-frequency element
fs: Frequency used for skin resistance calculation adj_LnetR: Resistance correction factor <For high-frequency-element parallel wiring model (1)>
[ΣLnetR-high-frequency element] is obtained for the case of noting the wiring pattern 12 out of the wiring patterns 12 and 15.

$$[\Sigma \text{LnetR-high-frequency element}] = \Sigma(([R11+RS11 \times \sqrt{(fs)}] \times [L \text{ high-frequency element}]) \times \text{adj\_LnetR}),$$

where
R11: DC resistance value of each high-frequency element corresponding to wiring pattern 12
RS11: Skin resistance coefficient of each high-frequency element corresponding to wiring pattern 12
[L high-frequency element]:Length of each high-frequency element
fs: Frequency used for skin resistance calculation adj_LnetR: Resistance correction factor <For high-frequency-element parallel wiring model (2)>
[LnetR-high-frequency element] is obtained for the case of noting the wiring pattern 15 out of the wiring patterns 12 and 15.

$$[\text{LnetR-high-frequency element}] = \Sigma(([R22+RS22 \times \sqrt{(fs)}] \times [L \text{ high-frequency element}]) \times \text{adj\_LnetR}),$$

where
R22: DC resistance value of each high-frequency element corresponding to wiring pattern 15
RS22: Skin resistance coefficient of each high-frequency element corresponding to wiring pattern 15
[L high-frequency element]: Length of each high-frequency element
fs: Frequency used for skin resistance calculation adj_LnetR: Resistance correction factor When the resistance integration in step SA7 is completed, the control section 2 executes the processing in step SA8. In this case, as shown in FIG. 12, it is assumed that the portion 101 (portion 102) of W2 (1Ω) (W30 (1.2Ω)) reaches a limit at the d-ed side (d-ing side).

In step SA8, the control section 2 selects a conversion object of a RLC model. Specifically, as shown in FIG. 12, the control section 2 uses a high-frequency element which does not reach a limit (in FIG. 12, a high-frequency element upper than the portions 101 and 102) as a RLC-model conversion object. High-frequency elements other than the above are used as high-frequency-element-model conversion objects.

That is, step SA8 is the processing for decreasing analysis time by using a high-frequency element having a small high-frequency element delay tpd which greatly influences increase of the analysis time as a RLC model. Moreover, a limit is set in order to prevent the accuracy of an analysis result from lowering.

In step SA9, the wiring-model generation section 4 executes the mixed modeling of changing a high-frequency element to be converted into a RLC model to a RLC model and a high-frequency element to be converted into a high-frequency element model into a high-frequency element (RLC model+high-frequency element mode: refer to FIG. 10). In this case, a skin resistance corresponding to fs (frequency used for skin resistance calculation) is superimposed on the DC resistance of a RLC model. Moreover, the value of a skin resistance to be superimposed can be changed in accordance with the setting using the input section 1.

In step SA10, mixed-model analysis is executed. Specifically, the RLC-model analysis section 6 executes an analysis in accordance with a RLC model among mixed models. However, the high-frequency-element-model analysis section 5 executes an analysis in accordance with a high-frequency element model among the mixed models. In step SA11, the control section 2 makes the display section 7 display analysis results of the mixed models. In this case, the present inventor confirms the time of an analysis according to a mixed model is greatly decreased to approx. 11 h compared to approx. 3,000 h which is the time of an analysis according to only a high-frequency element model.

Figure 13:
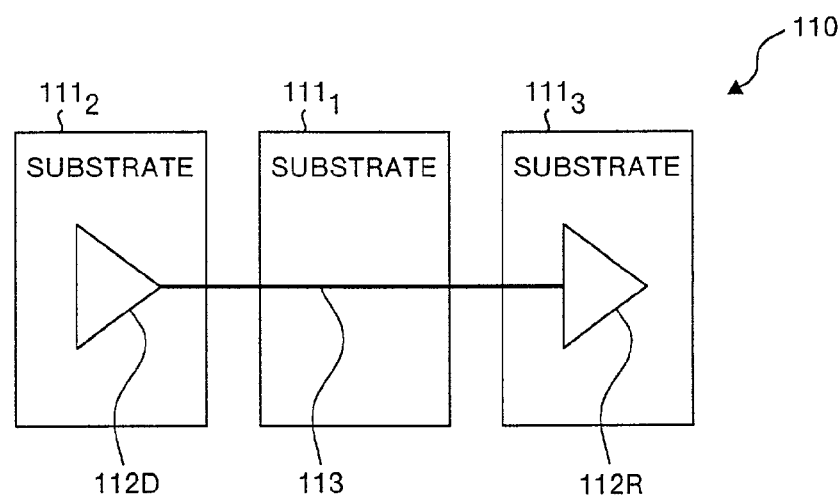
FIG. 13 is an illustration showing a modification 1 of the embodiment in FIG. 1.

The embodiment can be applied to a substrate 110 constituted of three substrates 1112 to 1113 as a modification 1 as shown in FIG. 13. The substrate 1112 is provided with a driver 112D and the substrate 1113 is provided with a receiver 112R. A wiring pattern 113 is formed from the substrate 1111 to the substrate 1113.

As described above, according to the embodiment, an analysis is executed in accordance with a mixed model in which a high-frequency element having a small high-frequency element delay causing analysis time to increase is used as a RLC model and a high-frequency element having high-frequency element delays other than the above delay is used as mixed models when the total resistance value [LnetR] serves as a first threshold value or more for a preset threshold value [LnetR-mg] or more. Therefore, it is possible to decrease a high-frequency-corresponding analysis time.

Moreover, according to the embodiment, when the total resistance value [LnetR] is less than the preset threshold value [LnetR-mg], all elements are analyzed as RLC models. Therefore, it is possible to correspond to a case unnecessary for corresponding to a high frequency and thus, improve flexibility.

Furthermore, a skin resistance value is superimposed on the DC resistance value of a RLC model. Therefore, it is possible to decrease the analysis error corresponding to an element not corresponding to a high frequency and improve the analysis accuracy.

An embodiment of the present invention is described above by referring to the accompanying drawings. However, a specific configuration is not restricted to the embodiment. Design modifications are included in the present invention as long as they are not deviated from the gist of the present invention. For example, it is also permitted to realize a function of a high-frequency-corresponding simulation apparatus by recording a computer program that realizes the function of the high-frequency-corresponding simulation apparatus shown in FIG. 1 in the computer-readable recording medium 300 shown in FIG. 14, making the computer 200 shown in FIG. 14 read the high-frequency-corresponding simulation program recorded in the recording medium 300, and executing the program.

Figure 14:
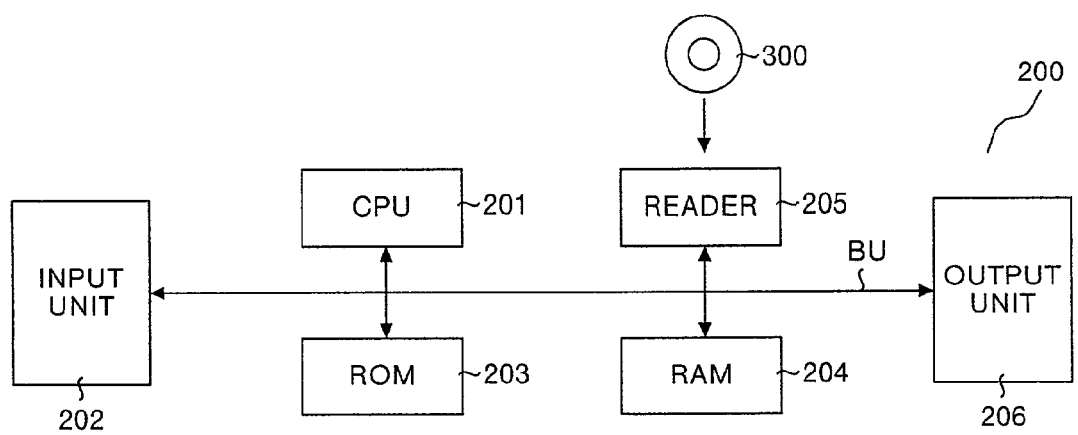
FIG. 14 is a block diagram showing a modification 2 of the embodiment in FIG. 1.
Figure 15:
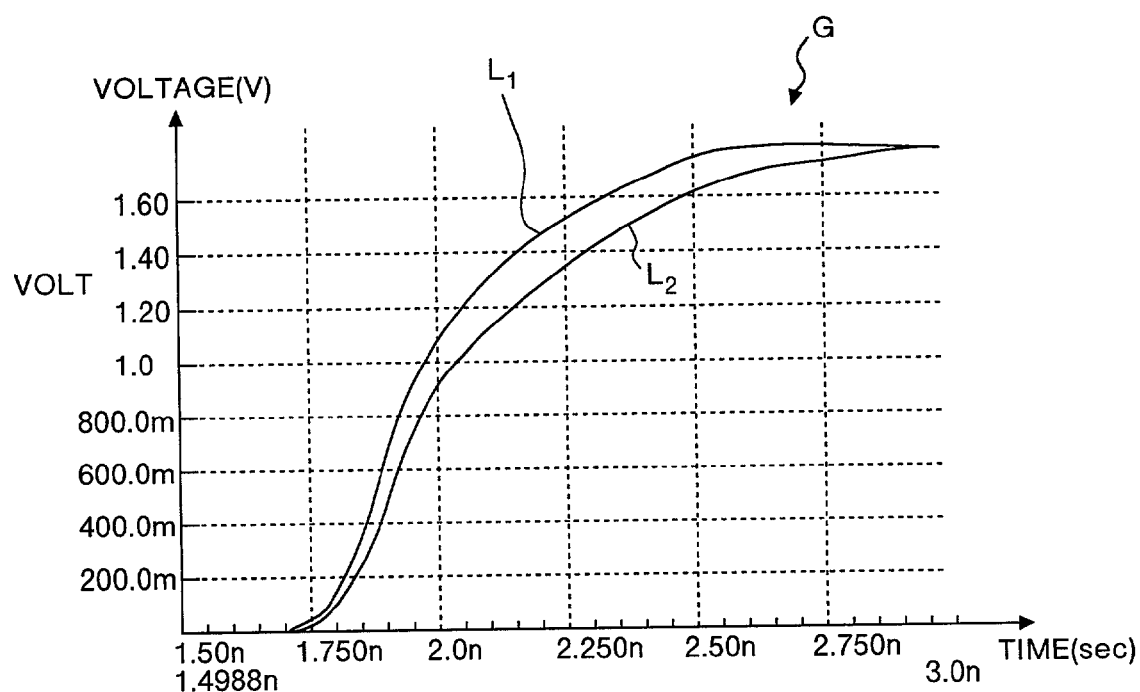
FIG. 15 is an illustration for explaining problems of a conventional skin effect.

The computer 200 shown in FIG. 14 is constituted of a CPU 201 for executing the high-frequency-corresponding simulation program, an input unit 202 including a keyboard and mouse, a ROM (Read Only Memory) 203 for storing various data values, a RAM (Random Access Memory) 204 for storing operation parameters and the like, a reader 205 for reading the high-frequency-corresponding simulation program from the recording medium 300, an output unit 206 including a display and printer, and a bus BU for connecting sections of the apparatus.

The CPU 201 realizes the function of the high-frequency-corresponding simulation apparatus by reading the high-frequency-corresponding simulation program from the recording medium 300 via the reader 205 and then executing the high-frequency-corresponding simulation program. The recording medium 300 includes not only portable recording media such as an optical disk, floppy disk, and hard disk but also a transmission medium for temporarily holding data such as a network.

As described above, according to the present invention, when the total resistance value corresponding to a plurality of elements is equal to or larger than a first threshold value, an analysis is executed in accordance with a mixed model obtained by using a high-frequency element having a small high-frequency-element delay causing analysis time to increase as a RLC model and high-frequency elements other than the high-frequency element having a small high-frequency-element delay as high-frequency element models. Therefore, an advantage is obtained that it is possible to decrease the analysis time corresponding to a high frequency.

Moreover, according to the present invention, when the total resistance value is less than a first threshold value, analysis is executed by using all elements as RLC models. Therefore, an advantage is obtained that the flexibility can be improved because it is possible to correspond to a case unnecessary for corresponding to a high frequency.

Furthermore, according to the present invention, a skin resistance value is superimposed on the DC resistance value of a RLC model. Therefore, it is possible to reduce an analysis error corresponding to an element not corresponding to a high frequency and improve an analysis accuracy.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A high-frequency-corresponding simulation apparatus comprising:
    an element setting unit which sets a plurality of elements corresponding to wiring patterns in accordance with circuit design information;
    a resistance-value calculation unit which calculates the total of resistance values each of which is the sum of the DC resistance value and skin resistance value of each of the elements as the total resistance value;
    a first determination unit which determines whether the total resistance value is less than a first threshold value;
    a sorting unit which sorts resistance values corresponding to the elements when the total resistance value is equal to or larger than the first threshold value in accordance with a determination result by said first determination unit;
    a second determination unit which integrates the resistance values starting with a resistance value having the smallest high-frequency element delay and determines whether the integration result reaches a value immediately before a second threshold value whenever the integration is executed; and
    an analysis unit which executes an analysis by using at least one of the elements corresponding to an integrated resistance value as a RLC model and using other elements than the at least one of said elements as high-frequency element models when said second determination unit determines that the integration result reaches the value immediately before the second threshold value.

2. The high-frequency-corresponding simulation apparatus according to claim 1, wherein said analysis unit executes an analysis by using all elements as RLC models when the total resistance value is less than the first threshold value.

3. The high-frequency-corresponding simulation apparatus according to claim 1, wherein said analysis unit superimposes a skin resistance value on a DC resistance value of a RLC model.

4. The high-frequency-corresponding simulation apparatus according to claim 1, further comprising a setting change unit which changes the value of the second threshold value.

5. The high-frequency-corresponding simulation apparatus according to claim 4, wherein said setting change unit also changes the value of a skin resistance value to be superimposed on the DC resistance value.

6. The high-frequency-corresponding simulation apparatus according to claim 1, wherein said circuit is constituted of a plurality of substrates.

7. A high-frequency-corresponding simulation method comprising the steps of:
    setting a plurality of elements corresponding to wiring patterns in accordance with circuit design information;
    calculating the total of resistance values each of which is the sum of the DC resistance value and skin resistance value of each of the elements as the total resistance value;
    determining whether the total resistance value is less than a first threshold value;
    sorting resistance values corresponding to the elements by using a high-frequency element delay as a key when it is determined that the total resistance value is equal to or larger than the first threshold value;
    integrating the resistance values starting with a resistance value having the smallest high-frequency element delay;
    determining whether the result of integration reaches a value immediately before a second threshold value whenever the integration is executed; and
    executing an analysis by using at least one of the elements corresponding to an integrated resistance value as a RLC model and using other elements than the at least one of said elements as high-frequency element models when it is determined that the integration result reaches the value immediately before the second threshold value.

8. A computer-readable recording medium which stores a computer program which when executed on a computer performs a method comprising:
    setting a plurality of elements corresponding to wiring patterns in accordance with circuit design information;

calculating the total of resistance values each of which is the sum of the DC resistance value and skin resistance value of each of the elements as the total resistance value;

determining whether the total resistance value is less than a first threshold value;

sorting resistance values corresponding to the elements by using a high-frequency element delay as a key when it is determined that the total resistance value is equal to or larger than the first threshold value;

integrating the resistance values starting with a resistance value having the smallest high-frequency element delay;

determining whether the result of integration reaches a value immediately before a second threshold value whenever the integration is executed; and executing an analysis by using at least one of the elements corresponding to an integrated resistance value as a RLC model and using other elements than the at least one of said elements as high-frequency element models when it is determined that the integration result reaches the value immediately before the second threshold value.

9. A computer program which when executed on a computer performs a method comprising:

setting a plurality of elements corresponding to wiring patterns in accordance with circuit design information;

calculating the total of resistance values each of which is the sum of the DC resistance value and skin resistance value of each of the elements as the total resistance value;

determining whether the total resistance value is less than a first threshold value;

sorting resistance values corresponding to the elements by using a high-frequency element delay as a key when it is determined that the total resistance value is equal to or larger than the first threshold value;

integrating the resistance values starting with a resistance value having the smallest high-frequency element delay;

determining whether the result of integration reaches a value immediately before a second threshold value whenever the integration is executed; and executing an analysis by using at least one of the elements corresponding to an integrated resistance value as a RLC model and using other elements than the at least one of said elements as high-frequency element models when it is determined that the integration result reaches the value immediately before the second threshold value.

10. A high-frequency simulation apparatus for a circuit, comprising:

a first determination unit determining a total of resistance values, each resistance value being a sum of a direct current resistance value and a skin resistance value of a corresponding element in the circuit to be simulated;

a second determination unit determining whether the total resistance value is less than a first threshold value;

a sorting unit sorting the resistance values corresponding to the elements of the circuit when the total resistance value is at least equal to the first threshold value according to said second determination unit, to produce sorted resistance values; and a third determination unit determining an integration result, obtained by integrating as many as possible of the sorted resistance values that can be integrated without exceeding a second threshold value.

11. The high-frequency simulation apparatus according to claim 10, further comprising an analysis unit executing an analysis by using at least one of the elements corresponding to an integrated resistance value as an RLC model and using other elements as high-frequency element models when said third determination unit determines that the integration result reaches the predetermined value immediately before the second threshold value.

12. The high-frequency simulation apparatus according to claim 11, wherein said analysis unit executes the analysis by using RLC models for all of the elements of the circuit when the total resistance value is less than the first threshold value.

* * * * *

UNITED STATES PATENT AND TRADEMARK OFFICE
CERTIFICATE OF CORRECTION

PATENT NO.       : 7,103,525 B2
APPLICATION NO.  : 09/929047
DATED            : September 5, 2006
INVENTOR(S)      : Makoto Suwada et al.

It is certified that error appears in the above-identified patent and that said Letters Patent is hereby corrected as shown below:

On Title Page
First Page Column 2 item 56 (Other Publications), Line 2, change "1992 p. 508-511." to --1992, pp. 508-511.--.

On Title Page
First Page Column 2 item 56 (Other Publications), Line 3, change " "Line" to --"Line--.

On Title Page
First Page Column 2 item 56 (Other Publications), Line 4, change "Fujitsu p. 297-302." to --Fujitsu, pp. 297-302.--.

On Title Page
First Page Column 2 item 56 (Other Publications), Line 6, change "IEEE p. 1043-1046." to --IEEE, pp. 1043-1046.--.

On Title Page
First Page Column 2 item 57 (Abstract), Line 5, after "circuit" change "deign" to --design--.

Signed and Sealed this

Twenty-third Day of January, 2007

JON W. DUDAS
*Director of the United States Patent and Trademark Office*